United States Patent
Saito et al.

(10) Patent No.: US 8,829,608 B2
(45) Date of Patent: Sep. 9, 2014

(54) SEMICONDUCTOR DEVICE

(75) Inventors: Wataru Saito, Kanagawa-ken (JP);
Syotaro Ono, Kanagawa-ken (JP);
Shunji Taniuchi, Kanagawa-ken (JP);
Miho Watanabe, Miyagi-ken (JP);
Hiroaki Yamashita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 657 days.

(21) Appl. No.: 13/051,987

(22) Filed: Mar. 18, 2011

(65) Prior Publication Data
US 2012/0012929 A1   Jan. 19, 2012

(30) Foreign Application Priority Data
Jul. 16, 2010  (JP) .................................. 2010-161426

(51) Int. Cl.
*H01L 29/78* (2006.01)
(52) U.S. Cl.
USPC .................................. 257/331; 257/E29.257
(58) Field of Classification Search
USPC .................. 257/330–335, 341, 342, E29.257, 257/E29.262; 438/270–272
See application file for complete search history.

(56) References Cited

U.S. PATENT DOCUMENTS

| | | | |
|---|---|---|---|
| 6,008,520 A | 12/1999 | Darwish et al. | |
| 6,545,316 B1 | 4/2003 | Baliga | |
| 6,621,132 B2 * | 9/2003 | Onishi et al. | 257/409 |
| 6,849,880 B1 | 2/2005 | Saito et al. | |
| 7,713,822 B2 * | 5/2010 | Thorup et al. | 438/270 |

(Continued)

FOREIGN PATENT DOCUMENTS

| | | |
|---|---|---|
| CN | 1447987 A | 10/2003 |
| CN | 101060132 A | 10/2007 |

(Continued)

OTHER PUBLICATIONS

Chinese Office Action dated Sep. 6, 2013, filed in Chinese counterpart Application No. 201110113071.9, 14 pages (with translation).

(Continued)

*Primary Examiner* — Daniel Shook
(74) *Attorney, Agent, or Firm* — Patterson & Sheridan, LLP

(57) ABSTRACT

According to one embodiment, a semiconductor device includes a first semiconductor layer of a first conductivity type, a second semiconductor layer of the first conductivity type, a third semiconductor layer of a second conductivity type, a fourth semiconductor layer of the second conductivity type, a fifth semiconductor layer of the first conductivity type, a control electrode, a first main electrode, a second main electrode, and a sixth semiconductor layer of the first conductivity type. The second semiconductor layer and the third semiconductor layer are alternately provided on the first semiconductor layer in a direction substantially parallel to a major surface of the first semiconductor layer. The fourth semiconductor layer is provided on the second semiconductor layer and the third semiconductor layer. The fifth semiconductor layer is selectively provided on a surface of the fourth semiconductor layer. The control electrode is provided in a trench via an insulating film. The trench penetrates through the fourth semiconductor layer from a surface of the fifth semiconductor layer and is in contact with the second semiconductor layer. The first main electrode is connected to the first semiconductor layer. The second main electrode is connected to the fourth semiconductor layer and the fifth semiconductor layer. The sixth semiconductor layer is provided between the fourth semiconductor layer and the second semiconductor layer. An impurity concentration of the sixth semiconductor layer is higher than an impurity concentration of the second semiconductor layer.

20 Claims, 12 Drawing Sheets

(56) References Cited

U.S. PATENT DOCUMENTS

| | | |
|---|---|---|
| 2005/0179082 A1 | 8/2005 | Miyata et al. |
| 2006/0216896 A1* | 9/2006 | Saito et al. .................... 438/270 |
| 2007/0013000 A1 | 1/2007 | Shiraishi |
| 2007/0114602 A1 | 5/2007 | Saito et al. |
| 2007/0249142 A1 | 10/2007 | Hisanaga |
| 2008/0237774 A1 | 10/2008 | Ono et al. |

FOREIGN PATENT DOCUMENTS

| | | |
|---|---|---|
| JP | 2006093457 A | 4/2006 |
| JP | 2008-103563 | 5/2008 |
| WO | 2011093473 A1 | 8/2011 |

OTHER PUBLICATIONS

Japanese Office Action dated Dec. 4, 2013, filed in Japanese counterpart Application No. 2010-161426, 6 pages (with translation).

Taiwanese Office Action dated Jan. 7, 2014, filed in Taiwan counterpart Application No. 100109008, 19 pages (with translation).

* cited by examiner

SEMICONDUCTOR DEVICE

CROSS-REFERENCE TO RELATED APPLICATIONS

This application is based upon and claims the benefit of priority from the prior Japanese Patent Application No. 2010-161426, filed on Jul. 16, 2010; the entire contents of which are incorporated herein by reference.

FIELD

Embodiments described herein relate generally to a semiconductor device.

BACKGROUND

For power MOSFETs (Metal Oxide Semiconductor Field Effect Transistors) having a vertical electrode structure, the on-resistance greatly depends on the electrical resistance of a drift layer. An impurity dope concentration that determines the electrical resistance of the drift layer is not increased above a limit in accordance with the breakdown voltage of the p-n junction formed by the base layer and the drift layer. Therefore, a tradeoff relationship exists between the device breakdown voltage and the on-resistance. It is important to improve this tradeoff in the devices of low power consumption. The tradeoff has a limit determined by the device material, and exceeding this limit leads to realizing a low on-resistance device superior to the existing power MOSFETs.

As an example of the MOSFETs to solve this problem, a structure is known in which a p-type pillar layer and an n-type pillar layer are embedded in the drift layer what is called a "super junction structure". In this super junction structure, by making the amount of charge (impurity amount) included in the p-type pillar layer and the n-type pillar layer the same, a pseudo-non-doped layer is created, and a current is passed through the highly doped n-type pillar layer while holding a high breakdown voltage. Thereby, a low on-resistance exceeding the material limit is realized. Thus, the tradeoff between the on-resistance and the breakdown voltage superior to those of the material limit can be achieved using the super junction structure. As a result, it is possible to reduce a chip area and increase an operation current density.

In the super junction structure, the more reducing a periodic cycle in the lateral direction, the more the impurity concentration of the n-type pillar layer can be increased, and a low on-resistance exceeding the material limit is realized. With the miniaturization of the super junction structure, it is required to miniaturize the MOS gate structure as well. Here, since the planar gate structure has a limit on miniaturization, it is effective to adopt the trench gate structure.

However, in the trench gate structure, when a drain voltage is applied, the gate-to-drain capacitance (Cgd) is decreased at a lower voltage than that in the planar structure. Therefore, the gate-to-drain capacitance is smaller than the drain-to-source capacitance (Cds), and the controllability of the gate at the time of switching is poor, thereby causing a problem of generating switching noise.

BRIEF DESCRIPTION OF THE DRAWINGS

FIG. 1A is a schematic cross-sectional view of the main part of the semiconductor device along line X-Y of FIG. 1B, and FIG. 1B is a schematic plan view of the main part when the cross-section along line A-B of FIG. 1A is viewed from above;

FIG. 2A is a schematic cross-sectional view of the main part of a process of forming a semiconductor layer on a drain layer, and FIG. 2B is a schematic cross-sectional view of the main part of a process of forming a super junction structure on the drain layer;

FIG. 3A is a schematic cross-sectional view of the main part of a process of forming a n-type layer on the pillar layer, and FIG. 3B is a schematic cross-sectional view of the main part of a process of forming a base layer on the super junction structure;

FIG. 4A is a schematic cross-sectional view of the main part of a process of forming a source layer on the surface of a base layer, and FIG. 4B is a schematic cross-sectional view of the main part of a process of forming a trench for an gate electrode;

FIG. 5A is a schematic cross-sectional view of the main part of a process of forming a gate electrode, and FIG. 5B is a schematic cross-sectional view of the main part of a process of forming a resist layer on the surface of the base layer;

FIG. 9A is a schematic cross-sectional view of a main part of the semiconductor device, FIG. 9B is a graph illustrating a relationship between a depth direction of the semiconductor device and an impurity concentration, and FIG. 9C is a graph illustrating a relationship between the depth direction of the semiconductor device and an electric field;

FIG. 10A is a schematic cross-sectional view of a main part of the semiconductor device, and FIG. 10B is a graph illustrating a relationship between a depth direction of the semiconductor device and an impurity concentration;

FIG. 12A is a schematic cross-sectional view of a main part of the semiconductor device, and FIG. 12B is a graph illustrating a relationship between a depth direction of the semiconductor device and an impurity concentration.

DETAILED DESCRIPTION

Figure 1A:
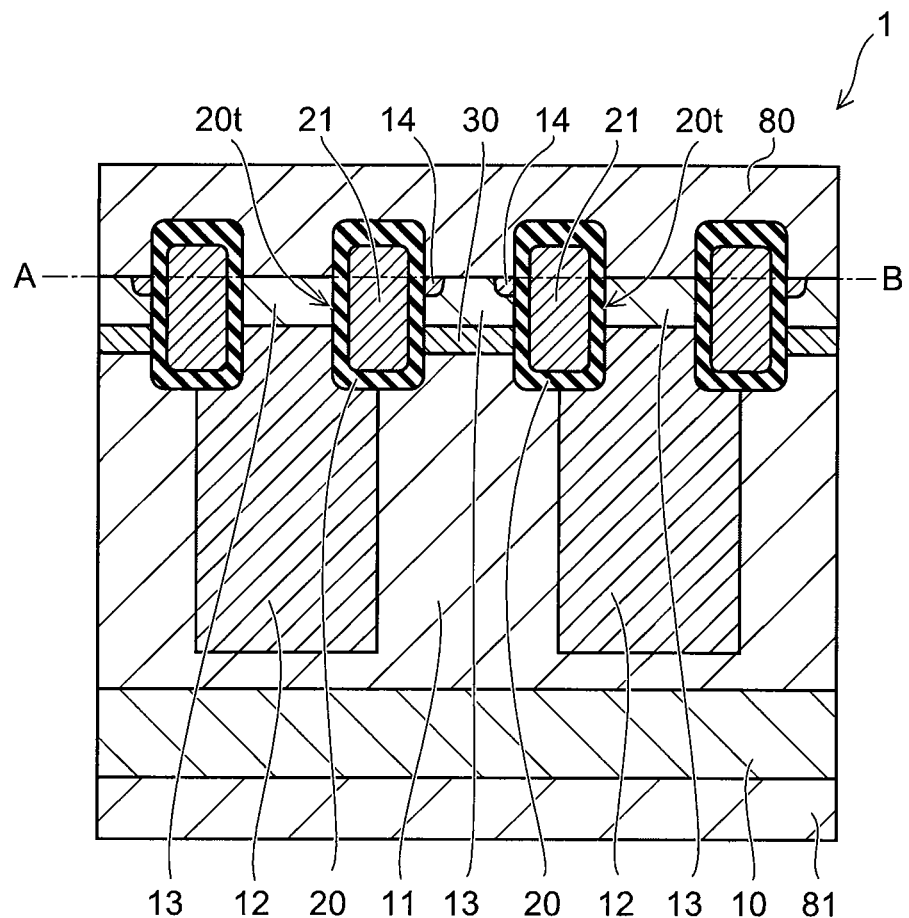
FIGS. 1A and 1B are schematic views of main parts of a semiconductor device according to a first embodiment, where

In general, according to one embodiment, a semiconductor device includes a first semiconductor layer of a first conductivity type, a second semiconductor layer of the first conductivity type, a third semiconductor layer of a second conductivity type, a fourth semiconductor layer of the second conductivity type, a fifth semiconductor layer of the first conductivity type, a control electrode, a first main electrode, a second main electrode, and a sixth semiconductor layer of the first conductivity type. The second semiconductor layer and the third semiconductor layer are alternately provided on the first semiconductor layer in a direction substantially parallel to a major surface of the first semiconductor layer. The fourth semiconductor layer is provided on the second semiconductor layer and the third semiconductor layer. The fifth semiconductor layer is selectively provided on a surface of the fourth semiconductor layer. The control electrode is provided in a trench via an insulating film. The trench penetrates through the fourth semiconductor layer from a surface of the fifth semiconductor layer and is in contact with the second semiconductor layer. The first main electrode is connected to the first semiconductor layer. The second main electrode is connected to the fourth semiconductor layer and the fifth semiconductor layer. The sixth semiconductor layer is provided between the fourth semiconductor layer and the second semiconductor layer. An impurity concentration of the sixth semiconductor layer is higher than an impurity concentration of the second semiconductor layer.

According to another embodiment, a semiconductor device includes a first semiconductor layer of a first conductivity type, a second semiconductor layer of the first conductivity type, a fourth semiconductor layer of a second conductivity type, a fifth semiconductor layer of the first conductivity type, a control electrode, an embedded electrode, a first main electrode, a second main electrode, and a sixth semiconductor layer of the first conductivity type. The second semiconductor layer is provided on the first semiconductor layer. The fourth semiconductor layer is provided on the second semiconductor layer. The fifth semiconductor layer is selectively provided on a surface of the fourth semiconductor layer. The control electrode is provided in a trench via a first insulating film. The trench penetrates through the fourth semiconductor layer from a surface of the fifth semiconductor layer and is in contact with the second semiconductor layer. The embedded electrode is provided in the trench via a second insulating film under the control electrode. The first main electrode is connected to the first semiconductor layer. The second main electrode is connected to the fourth semiconductor layer and the fifth semiconductor layer. The sixth semiconductor layer is provided between the fourth semiconductor layer and the second semiconductor layer. An impurity concentration of the sixth semiconductor layer is higher than an impurity concentration of the second semiconductor layer.

Embodiments will now be described with reference to the drawings.

First Embodiment

Figure 1B:
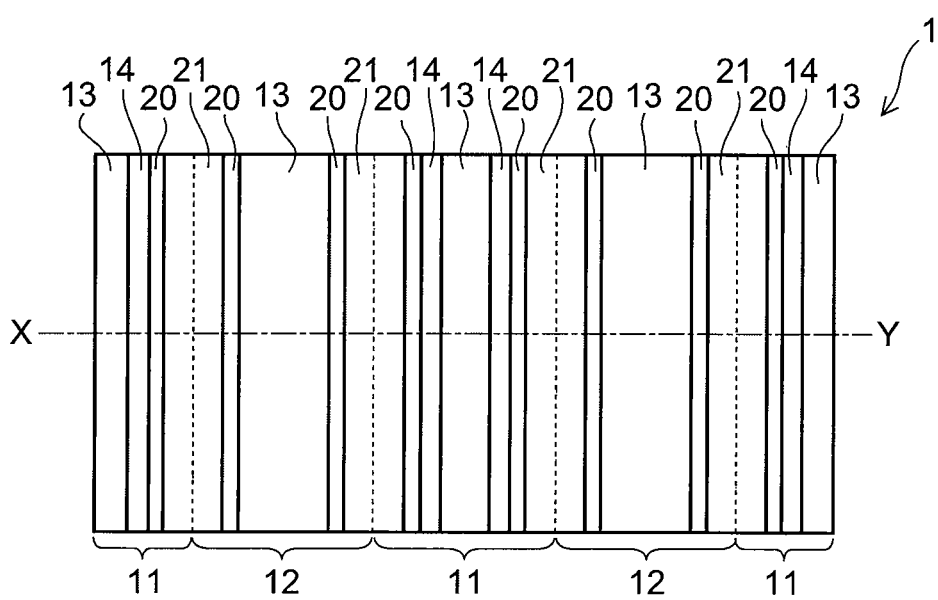

FIGS. 1A and 1B are schematic views of main parts of a semiconductor device according to the first embodiment. Specifically, FIG. 1A is a schematic cross-sectional view of the main part of the semiconductor device along line X-Y of FIG. 1B, and FIG. 1B is a schematic plan view of the main part when the cross-section along line A-B of FIG. 1A is viewed from above.

A semiconductor device 1 is a power semiconductor device. In the semiconductor device 1, on an $n^+$-type drain layer (first semiconductor layer) 10, an n-type pillar layer (second semiconductor layer) 11 having a pillar cross-section and a p-type pillar layer (third semiconductor layer) 12 having a pillar cross-section are provided. The conductivity type of the n-type pillar layer 11 is an n-type (first conductivity type), and the conductivity type of the p-type pillar layer 12 is a p-type (second conductivity type). In the semiconductor device 1, the n-type pillar layer 11 and the p-type pillar layer 12 are provided alternately in a direction substantially parallel to the major surface of the drain layer 10. As a result, the p-n junctions by the n-type pillar layer 11 and the p-type pillar layer 12 are periodically arranged on the major surface of the drain layer 10.

Namely, the semiconductor device 1 has a super junction structure in which the n-type pillar layers 11 and the p-type pillar layers 12 are periodically arranged repeatedly in a direction substantially parallel to the major surface of the drain layer 10.

In other words, in the case where an $n^-$-type drift layer is applied to the n-type pillar layer 11, the p-type pillar layers 12 are provided periodically in this drift layer. The n-type pillar layer 11 is connected to the major surface of the drain layer 10. The n-type pillar layer 11 is provided between the p-type pillar layer 12 and the drain layer 10. A lower end of the p-type pillar layer 12 may be connected to the drain layer 10.

A p-type base layer (fourth semiconductor layer) 13 is provided on the n-type pillar layer 11 and the p-type pillar layer 12. An $n^+$-type source layer (fifth semiconductor layer) 14 is selectively provided on the surface of the base layer 13. The source layer 13 having the source layer 14 formed thereon, and the base layer 13 without having the source layer 14 formed thereon are disposed alternately and repeatedly in a direction substantially parallel to the major surface of the drain layer 10.

In the semiconductor device 1, a trench 20t is provided so as to penetrate through the base layer 13 from the surface of the source layer 14 to be in contact with the n-type pillar layer 11. For example, the trench 20t is provided so as to extend from the surface of the base layer 13 to the insides of the n-type pillar layer 11 and the p-type pillar layer 12 to be in contact with the source layer 14. The trench 20t is located between the n-type pillar layer 11 and the p-type pillar layer 12. In other words, two of the trenches 20t are in contact with the n-type pillar layer 11. These trenches 20t are in contact with the n-type pillar layer 11 and also in contact with the p-type pillar layer 12.

In the trench 20t, a gate electrode (control electrode) 21 having a trench configuration is provided via the gate insulating film (first insulating film) 20. The gate electrode 21 is adjacent to the base layer 13, the source layer 14, the n-type layer 30, and the n-type pillar layer 11 via the gate insulating film 20.

An n-type layer (sixth semiconductor layer) 30 is provided between the base layer 13 having the source layer 14 formed thereon and the n-type pillar layer 11. This n-type layer 30 contains n-type impurities having concentration higher than that of the n-type pillar layer 11. The bottom surface of the n-type layer 30 is located closer to the base layer 13 than the lower end of the gate electrode 21. In other words, the distance between the bottom surface of the n-type layer 30 and the bottom surface of the base layer 13 is smaller than the distance between the lower end of the gate electrode 21 and the bottom surface of the base layer 13.

The drain layer 10 is electrically connected to a drain electrode (first main electrode) 81 provided under the drain layer 10. A source electrode 80 is provided on the base layer 13 and the source layer 14. The base layer 13 and the source layer 14 are electrically connected to the source electrode (second main electrode) 80. In the embodiment, the source electrode 80 side is taken as the upper side, and the drain electrode 81 side is taken as the lower side.

In the plane of the semiconductor device 1, the n-type pillar layer 11 and the p-type pillar layer 12 extend substantially perpendicular to a direction in which the n-type pillar layers 11 and the p-type pillar layers 12 are arranged alternately. The base layer 13, the source layer 14 and the gate electrode 21 extend substantially perpendicular to the direction in which the n-type pillar layers 11 and the p-type pillar layers 12 are arranged alternately. Namely, the n-type pillar layers 11, the p-type pillar layers 12, the base layers 13, the source layers 14 and the gate electrodes 21 extend in a stripe configuration in the same direction, respectively. The n-type layer 30 also extends in an extending direction of the base layer 13.

The main component of the drain layer 10, the n-type pillar layer 11, the p-type pillar layer 12, the base layer 13, the source layer 14 and the n-type layer 30 is silicon (Si), for example. The impurity concentration of the n-type pillar layer 11 is higher than that of the base layer 13. A material of the gate insulating film 20 is silicon oxide ($SiO_2$), for example. A material of the gate electrode 21 is polysilicon (poly-Si), for example. The main component of the source electrode 80 and the drain electrode 81 is, for example, aluminum (Al), copper (Cu), or the like.

Next, a method for manufacturing the semiconductor device 1 will be described.

Figure 2A:
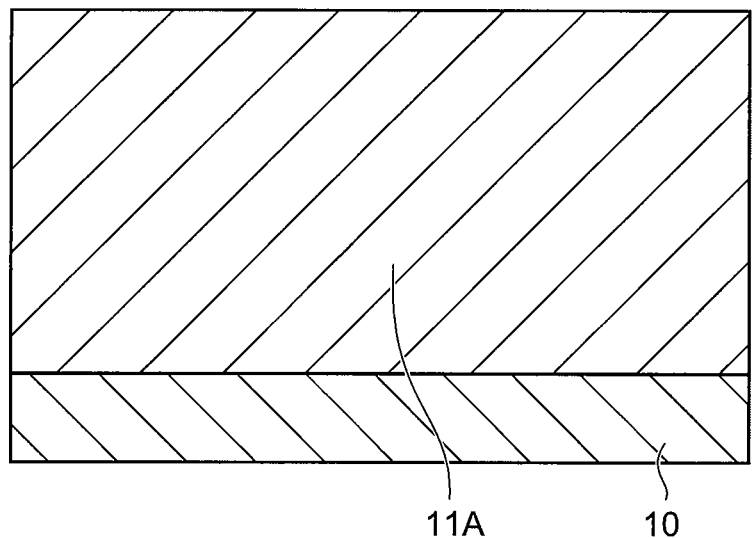
FIGS. 2A and 2B are schematic cross-sectional views of main parts for illustrating manufacturing processes of the semiconductor device according to the first embodiment, where
Figure 2B:
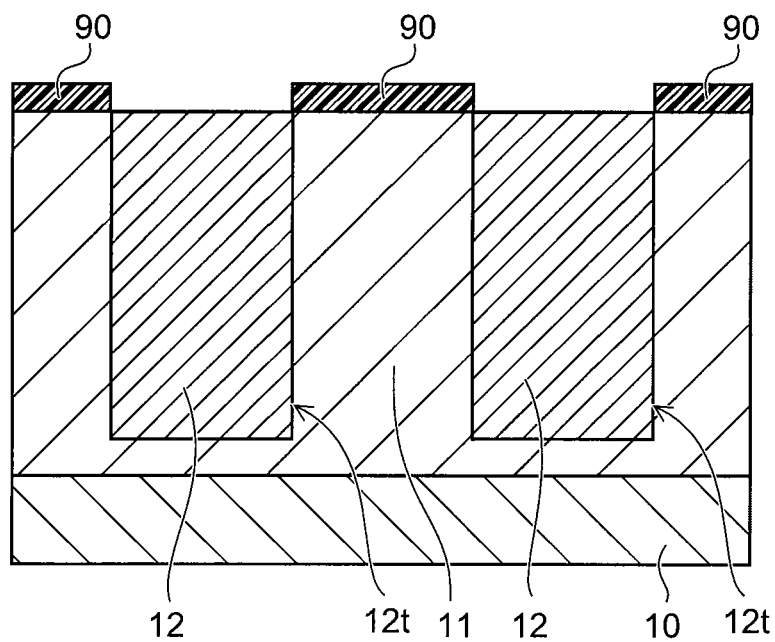

FIGS. 2A and 2B are schematic cross-sectional views of main parts for illustrating manufacturing processes of the semiconductor device according to the first embodiment. Specifically, FIG. 2A is a schematic cross-sectional view of the main part of a process of forming a semiconductor layer on a drain layer, and FIG. 2B is a schematic cross-sectional view of the main part of a process of forming a super junction structure on the drain layer.

First, as shown in FIG. 2A, a semiconductor layer 11A containing n-type impurities is formed on the major surface of the drain layer 10, which is a semiconductor substrate, by the epitaxial growth method. The semiconductor layer 11A is a base material of the n-type pillar layer 11.

Next, as shown in FIG. 2B, a mask 90 is selectively formed on the drain layer 10. A material of the mask 90 is silicon oxide ($SiO_2$), for example. Then, etching is performed on the drain layer 10 exposed from the mask 90 to selectively form a trench 12t in the drain layer 10. Furthermore, the p-type pillar layer 12 containing p-type impurities is formed in the trench 12t by the epitaxial growth method.

As a result, the super junction structure in which the n-type pillar layers 11 and the p-type pillar layers 12 are periodically arranged repeatedly is formed on the drain layer 10. After the super junction structure is formed, the mask 90 is removed.

Figure 3A:
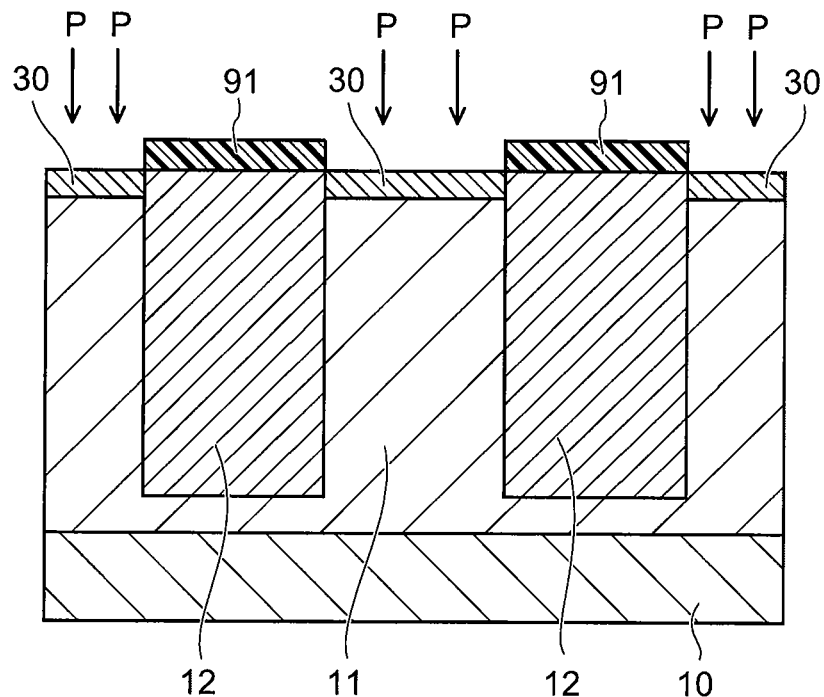
FIGS. 3A and 3B are schematic cross-sectional views of main parts illustrating manufacturing processes of the semiconductor device according to the first embodiment, where
Figure 3B:
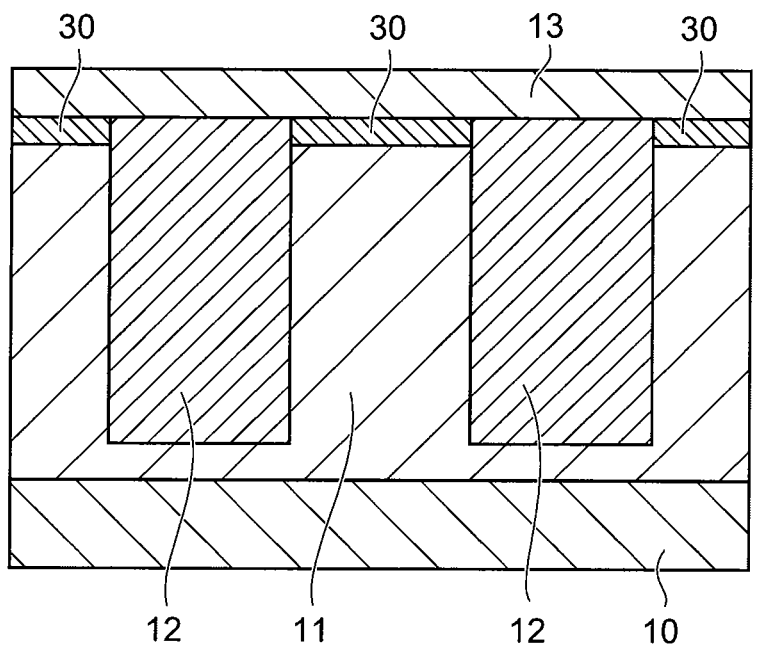

FIGS. 3A and 3B are schematic cross-sectional views of main parts illustrating manufacturing processes of the semiconductor device according to the first embodiment. Specifically, FIG. 3A is a schematic cross-sectional view of the main part of a process of forming an n-type layer on the pillar layer, and FIG. 3B is a schematic cross-sectional view of the main part of a process of forming a base layer on the super junction structure.

Next, as shown in FIG. 3A, on the super junction structure, a mask 91 is formed so as to selectively expose the base layer 13. A material of mask 91 is silicon oxide ($SiO_2$), for example. Next, n-type impurities such as phosphorus (P) and the like are injected into the upper side of the n-type pillar layer 11 exposed from the mask 91. As a result, the n-type layer 30 containing n-type impurities having concentration higher than that of the n-type pillar layer 11 is formed in an upper layer of the n-type pillar layer 11.

Figure 4A:
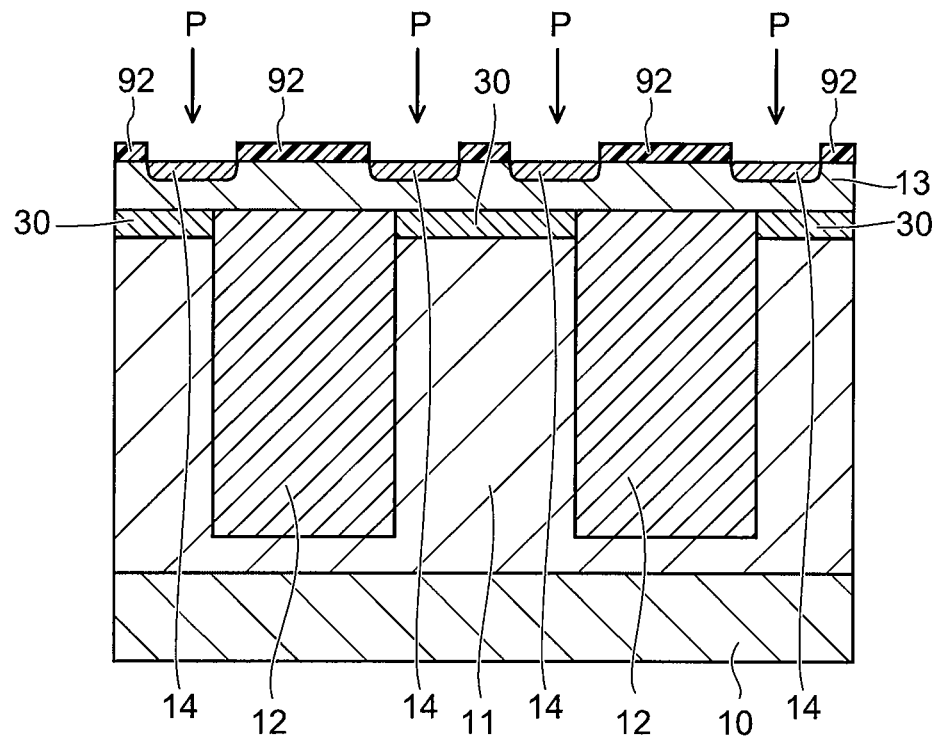
FIGS. 4A and 4B are schematic cross-sectional views of main parts for illustrating manufacturing processes of the semiconductor device according to the first embodiment, where
Figure 4B:
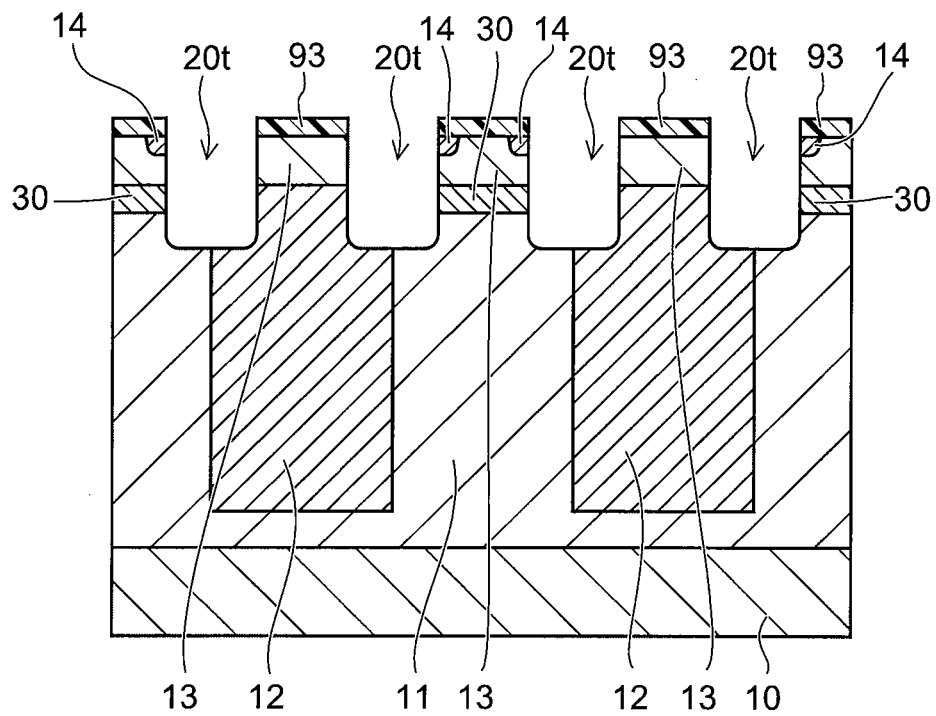

After removing the mask 91, as shown in FIG. 3B, the base layer 13 is formed on the p-type pillar layer 12 and the n-type layer 30. As a result, the base layer 13 is formed on the super junction structure. FIGS. 4A and 4B are schematic cross-sectional views of main parts for illustrating manufacturing processes of the semiconductor device according to the first embodiment. Specifically, FIG. 4A is a schematic cross-sectional view of the main part of a process of forming a source layer on the surface of a base layer, and FIG. 4B is a schematic cross-sectional view of the main part of a process of forming a trench for a gate electrode.

Next, as shown in FIG. 4A, a mask 92 is formed so as to selectively expose the surface of the base layer 13. A material of mask 92 is silicon oxide ($SiO_2$), for example. Next, n-type impurities such as phosphorus (P) or the like are injected into the base layer 13 exposed from the mask 92. As a result, the source layer 14 is selectively formed on the surface of the base layer 13. After forming the source layer 14, the mask 92 is removed. Next, as shown in FIG. 4B, a mask 93 is formed so as to selectively expose the base layer 13. A material of the mask 93 is silicon oxide ($SiO_2$), for example. Next, the trench 20t is formed by etching so as to extend from the surface of the base layer 13 exposed from the mask 93 to the insides of the n-type pillar layer 11 and the p-type pillar layer 12.

Figure 5A:
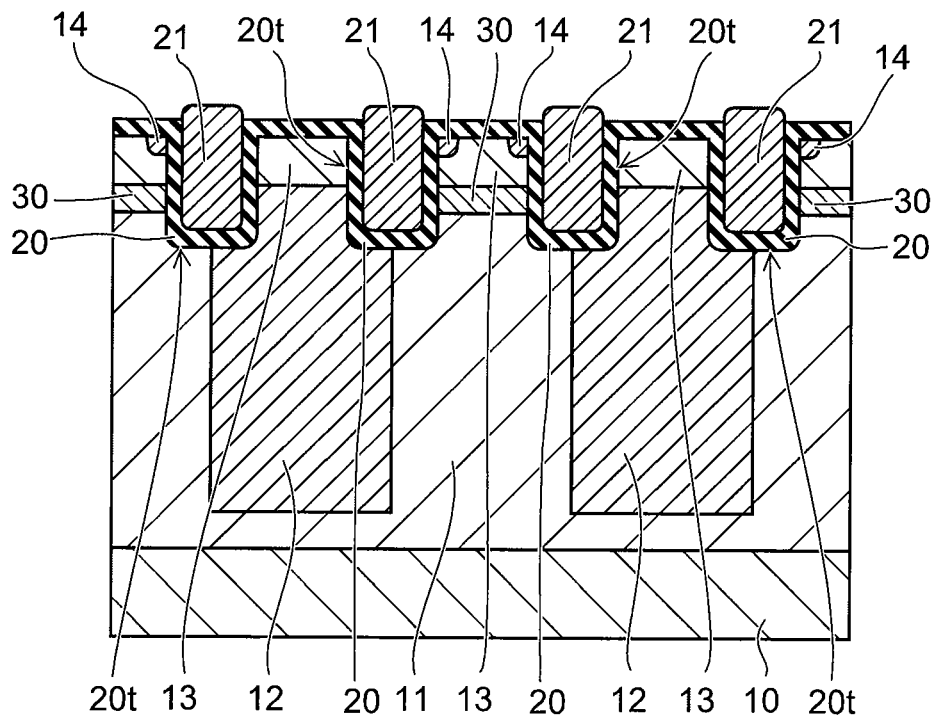
FIGS. 5A and 5B are schematic cross-sectional views of main parts for illustrating manufacturing processes of the semiconductor device according to the first embodiment, where
Figure 5B:
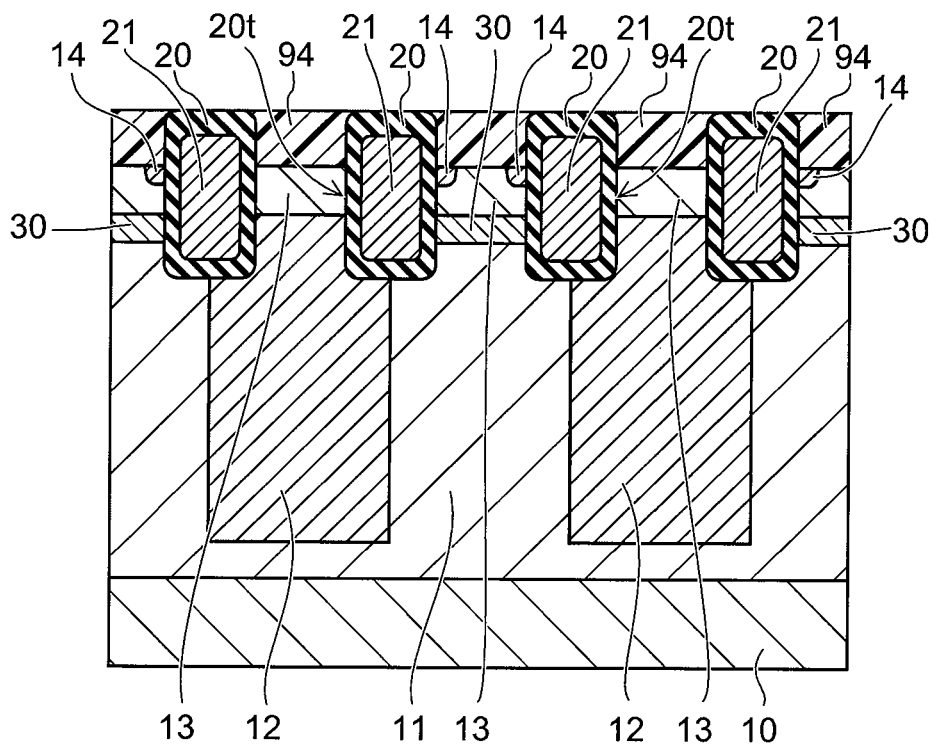

FIGS. 5A and 5B are schematic cross-sectional views of main parts for illustrating manufacturing processes of the semiconductor device according to the first embodiment. Specifically, FIG. 5A is a schematic cross-sectional view of the main part of a process of forming a gate electrode, and FIG. 5B is a schematic cross-sectional view of the main part of a process of forming a resist layer on the surface of the base layer.

Next, as shown in FIG. 5A, the trench 20t is exposed to the high-temperature oxidizing atmosphere, and the gate insulating film 20 is formed on the inner wall of the trench 20t.

Furthermore, the gate electrode 21 is formed in the trench 20t via the gate insulating film 20 by the CVD (Chemical Vapor Deposition). Then, the gate insulating film 20 formed on the base layer 13 and the source layer 14 is removed. Next, as shown in FIG. 5B, a resist layer 94 is selectively formed on the base layer 13 and the source layer 14. Thereafter, a gate insulating film 20 is further formed on the surface of the gate electrode 21 projected from the surface of the base layer 13 and exposed from the resist layer 94.

Thereafter, the resist layer 94 is removed, and as shown in FIGS. 1A and 1B, the source electrode 80 is formed on the base layer 13 and the source layer 14. Furthermore, the drain electrode 81 is formed under the drain layer 10. The semiconductor device 1 is formed by the foregoing manufacturing processes.

Next, the functional effect of the semiconductor device 1 will be described.

Before describing the functional effect of the semiconductor device 1, the functional effect of a semiconductor device 100 according to a comparative example will be described.

Figure 6:
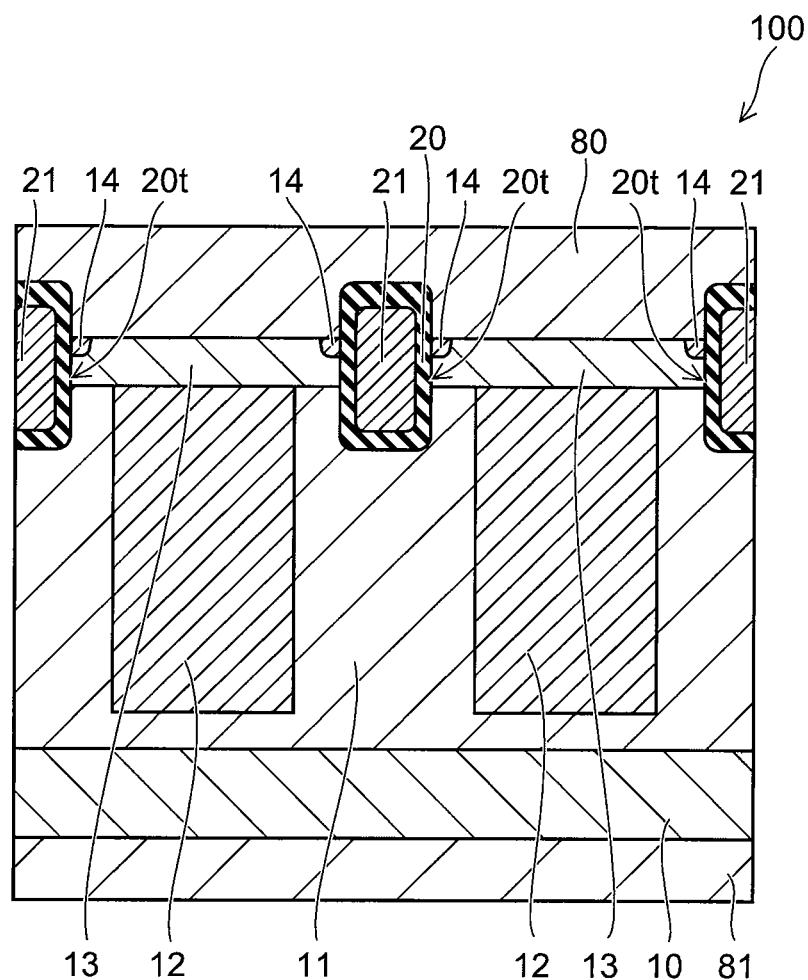
FIG. 6 is a schematic cross-sectional view of a main part of a semiconductor device according to a comparative example.

FIG. 6 is a schematic cross-sectional view of a main part illustrating a semiconductor device according to a comparative example.

In the semiconductor device 100 according to the comparative example, the above described n-type layer 30 is not provided. In the semiconductor device 100, the n-type pillar layer 11 and the p-type pillar layer 12 are provided on the drain layer 10. The semiconductor device 1 has the super junction structure in which the n-type pillar layer 11 and the p-type pillar layer 12 are periodically arranged repeatedly in a direction substantially parallel to the main surface of the drain layer 10.

The base layer 13 is provided on the n-type pillar layer 11 and the p-type pillar layer 12. The source layer 14 is selectively provided on the surface of the base layer 13. The trench 20t is provided from the surface of the base layer 13 to the inside of the n-type pillar layer 11. In the trench 20t, the gate electrode 21 is provided via the gate insulating film 20. The gate electrode 21 is adjacent to the base layer 13, the source layer 14 and the n-type pillar layer 11 via the gate insulating film 20.

The base layer 13 and the source layer 14 are electrically connected to the source electrode 80. The drain layer 10 is electrically connected to the drain electrode 81 provided under the drain layer 10.

When switching on the semiconductor device 100, with an applied voltage of a threshold voltage or higher onto the gate electrode 21, a channel is formed in the base layer 13 to which the gate electrode 21 opposes via the gate insulating film 20. Then, current flows across the source electrode 80 and the drain electrode 81 through the source layer 14, the channel, the n-type pillar layer 11 and the drain layer 10.

When switching off the semiconductor device 100, a depletion layer is extended from the p-n junction interface between the trench 20t and the n-type pillar layer 11, and the p-n junction interface between the n-type pillar layer 11 and the p-type pillar layer 12. In the super junction structure, the depletion layers that extend from the respective p-n junction interfaces are mutually connected, and the super junction structure is completely depleted. When switching off, even if a high voltage is applied across the source electrode 80 and the drain electrode 81, a main current path between the source electrode 80 and the drain electrode 81 is cut off, and the semiconductor device 100 maintains a high breakdown voltage.

However, in the semiconductor device 100, the distance from the trench 20t to the p-type pillar layer 12 is smaller than the distance from the center of the n-type pillar layer 11 to the p-type pillar layer 12. Namely, before the super junction structure is completely depleted, the surroundings of the trench 20t are depleted.

Therefore, in the semiconductor device 100, before the capacitance (Cds) between the drain electrode 81 and the source electrode 80 decreases rapidly, the capacitance (Cgd) between the gate electrode 21 and the drain electrode 81 decreases.

Figure 7A:
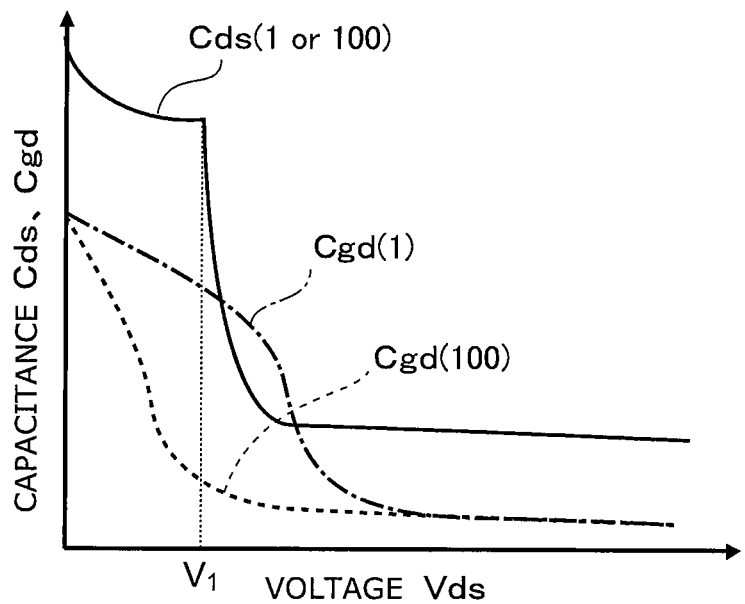
FIGS. 7A and 7B are graphs illustrating a relationship between Vds, Cds, and Cgd.
Figure 7B:
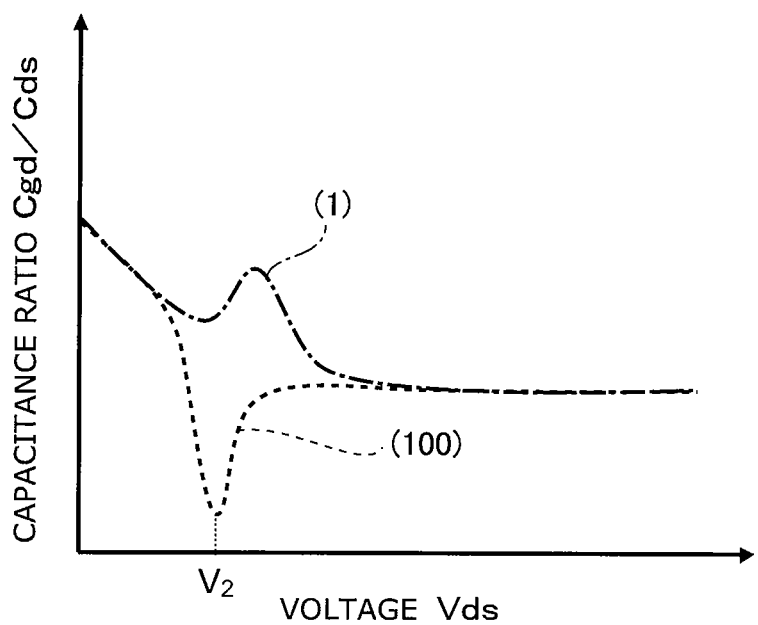

The relationship between Vds, and Cds and Cgd is shown in FIGS. 7A and 7B wherein, for example, a voltage across the drain electrode 81 and the source electrode 80 is denoted by Vds. In FIG. 7A, the horizontal axis indicates a voltage (Vds), and the vertical axis indicates capacitances (Cds and Cgd). In FIG. 7B, the horizontal axis indicates a voltage (Vds), and the vertical axis indicates capacitance ratio (Cgd/Cds). In FIGS. 7A and 7B, reference numerals "1" and "100" in parentheses indicate the semiconductor device 1 and the semiconductor device 100, respectively.

Changes in capacitance (Cds) between the drain electrode 81 and the source electrode 80 will be described in reference to FIG. 7A.

After an application of a voltage, in the initial stage (0 to $V_1$), Vds is relatively low. In this stage, since a junction area of the p-type pillar layer 12 and the n-type pillar layer 11 is large, the Cds shows a large value. However, when the voltage is increased to V1 or higher, the depletion layers which extend from the respective p-n junction interfaces are mutually connected in the super junction structure. As a result, the super junction structure is completely depleted. Therefore, at a voltage $V_1$ or higher, Cds decreases abruptly. After Cds decreases abruptly, since the super junction structure has already been completely depleted, irrespectively of an increase in Vds, Cds shows a substantially constant value. The foregoing changes in Cds may occur in the semiconductor devices 1 and 100 having the super junction structure.

Next, changes in capacitance (Cgd) between the gate electrode 21 and the drain electrode 81 will be described with reference to FIG. 7A.

First, changes in Cgd in the semiconductor device 100 according to the comparative example will be described.

After a voltage is applied, in the initial stage (0 to $V_1$), Vds is relatively low. An area that the trench 20t is in contact with the n-type pillar layer 11 is smaller than the junction area of the p-type pillar layer 12 and the n-type pillar layer 11. Thus, Cgd in the initial stage is smaller than Cds. Furthermore, before the super junction structure is completely depleted, the surroundings of the trench 20t are depleted. Thus, Cgd is decreased before Cds is abruptly decreased at a voltage of $V_1$ or higher.

On the other hand, in the semiconductor device 1 according to the first embodiment, the n-type layer 30 containing impurities having concentration higher than that of the n-type pillar layer 11 is provided between the adjoining trenches 20t. Therefore, when Vds is applied, with the existence of the n-type layer 30, the surroundings of the trench 20t are more difficult to be depleted as compared to the semiconductor device 100. As a result, in the semiconductor device 1, Cgd is decreased abruptly at a voltage higher than the voltage $V_1$.

Next, changes in capacitance ratio (Cgd/Cds) will be described with reference to FIG. 7B.

In the semiconductor devices 1 and 100, a switching operation is controlled by inputting a gate signal to the gate electrode 21.

Changes in voltage of the drain electrode 81 are determined by charge/discharge of Cds and Cgd. In the state where Cgd is small, the charge/discharge of Cds is given priority, and therefore it becomes difficult to control the voltage of the drain electrode 81 by the gate current. In this state, switching noise is likely to be generated.

In the semiconductor device 100 according to the comparative example, since Cgd is decreased at Vds which is lower than Vds at which Cds is decreased, a voltage (V2) exists at which Cgd/Cds is significantly decreased. Namely, the voltage exists at which the controllability by the gate electrode 21 is significantly lowered. Therefore, a switching noise is likely to be generated in the semiconductor device 100.

In contrast, in the semiconductor device 1, such voltage does not exist at which Cgd/Cds decreases significantly. Therefore, in the semiconductor device 1, the controllability by the gate is improved and a switching noise is less likely to be generated as compared to the semiconductor device 100.

In FIGS. 7A and 7B, such characteristic that Cgd is decreased at a voltage higher than a voltage at which Cds is decreased has been explained. However, Cgd/Cds is not be decreased abruptly also in the case where Cgd and Cds are deceased at the same voltage, and similar effects can be obtained.

Moreover, in the semiconductor device 1, by forming the n-type layer 30 to be deeper from the lower end of the base layer 13, it is possible to further increase Cgd. However, by locating the bottom surface of the n-type layer 30 of high concentration at a position shallower than the bottom surface of the trench 20t, it is possible to suppress the concentration of the electric field in the bottom portion of the trench 20t. In the semiconductor device 1, it is therefore possible to improve the breakdown voltage of the gate insulating film 20 and the reliability of the switching control by the gate electrode 21.

As described above, a switching noise of the semiconductor device 1 is decreased as compared to that of the semiconductor device 100.

Next, another embodiment will be described. In the following descriptions and drawings, elements identical with those of the semiconductor device 1 are denoted by the same reference numerals, and the detailed description thereof will be omitted as appropriate.

Second embodiment

Figure 8:
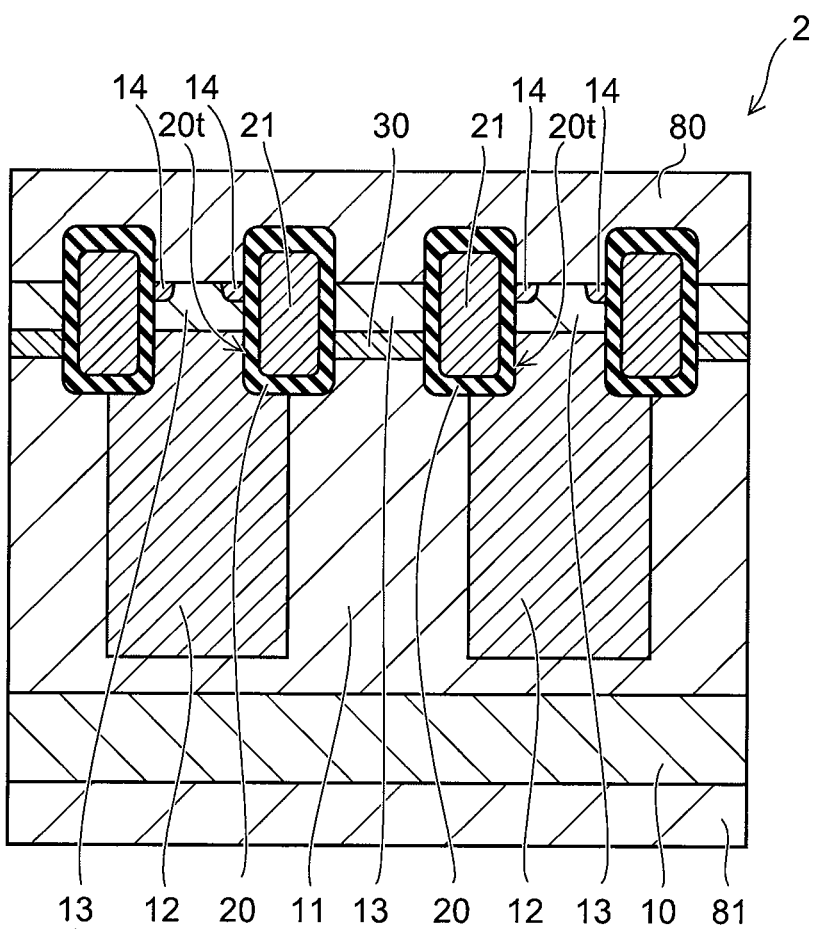
FIG. 8 is a schematic cross-sectional view of a main part of a semiconductor device according to a second embodiment.

FIG. 8 is a schematic cross-sectional view of a main part of a semiconductor device according to a second embodiment.

A semiconductor device 2 is a variation of the semiconductor device 1. In the semiconductor device 2, the source layer 14 is not provided on the surface of the base layer 13 which is sandwiched between two trenches 20t and provided on the n-type layer 30. Namely, the source layer 14 is not provided on the surface of the base layer 13 on the n-type layer 30. The source layers 14 of the semiconductor device 2 are selectively formed on the surface of the base layer 13 adjacent to the base layers 13 on the n-type layer 30 via the trenches 20t. The bottom surface of the n-type layer 30 is located closer to the base layer 13 than the lower end of the gate electrode 21. The distance between the bottom surface of the n-type layer 30 and the bottom surface of the base layer 13 is smaller than the distance between the lower end of the gate electrode 21 and the bottom surface of the base layer 13.

The semiconductor device 2 also has the functional effect similar to that of the semiconductor device 1 because the n-type layer 30 is provided between the base layer 13 and the n-type pillar layer 11.

In the semiconductor devices 1 and 2, electric field at a junction of the base layer 13 and the n-type layer 30 increases, and an avalanche breakdown is likely to occur at the junction.

However, in the semiconductor device 2, the source layer 14 is not provided on the surface of the base layer 13 on the n-type layer 30. Therefore, in the semiconductor device 2, the parasitic bipolar transistor by the source layer 14, the base layer 13 and the n-type layer 30 is not formed. Therefore, in the semiconductor device 2, a malfunction of the parasitic bipolar transistor is less likely to occur even if hole current due to the avalanche breakdown flows therein. As a result, the semiconductor device 2 has a high avalanche withstanding capability compared with the semiconductor device 1.

Third Embodiment

Figures 9A, 9B, 9C:
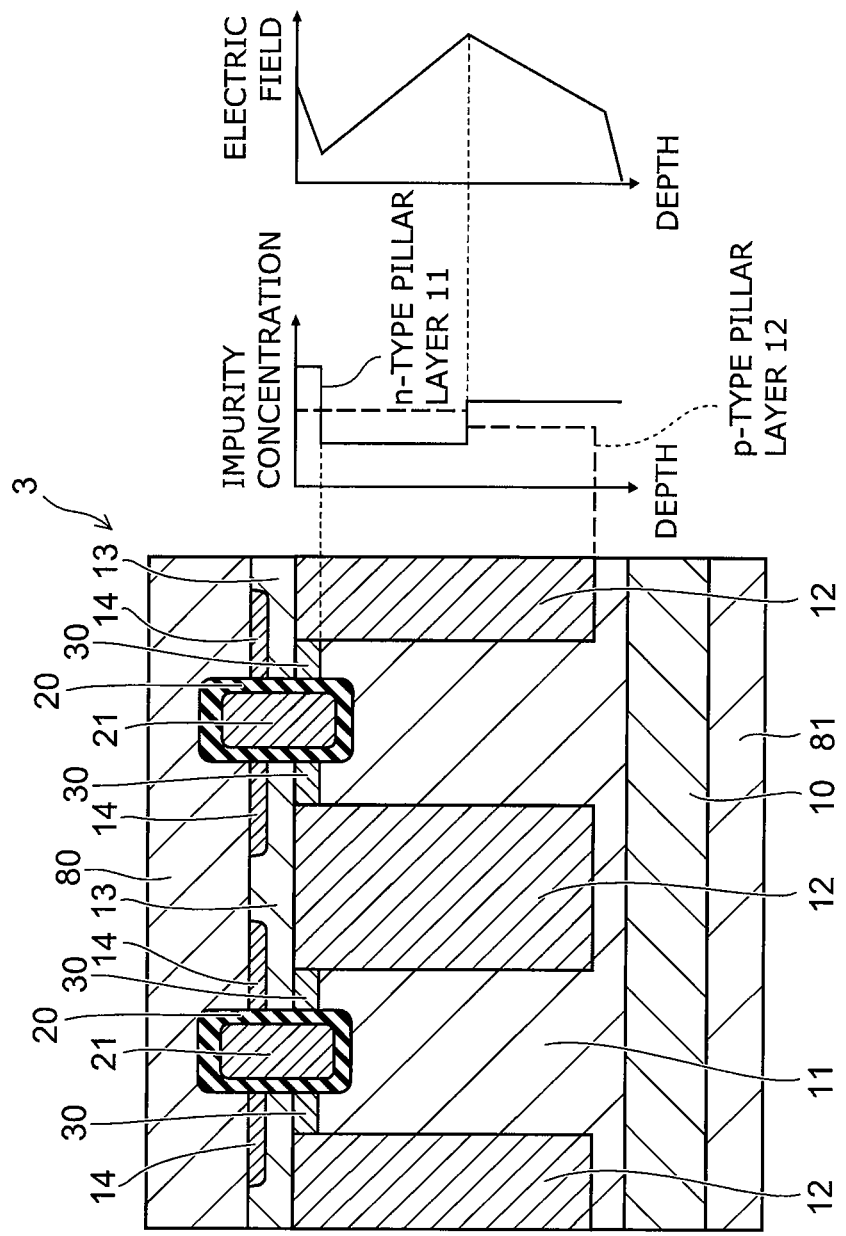
FIGS. 9A to 9C illustrate a semiconductor device according to a third embodiment, where

FIGS. 9A to 9C illustrate a semiconductor device according to a third embodiment. Specifically, FIG. 9A is a schematic cross-sectional view of a main part of the semiconductor device, FIG. 9B is a graph illustrating a relationship between a depth direction of the semiconductor device and an impurity concentration, and FIG. 9C is a graph illustrating a relationship between a depth direction of the semiconductor device and an electric field.

A semiconductor device 3 shown in FIG. 9A has a super junction structure in which the n-type pillar layers 11 and the p-type pillar layers 12 are periodically arranged repeatedly in a direction substantially parallel to the major surface of the drain layer 10. The base layer 13 is provided on the n-type pillar layer 11 and the p-type pillar layer 12. The source layer 14 is selectively provided on the surface of the base layer 13. The source layer 14 extends from the surface of the base layer 13 on the n-type pillar layer 11 to the surface of the base layer 13 on the p-type pillar layer 12.

The trench 20t penetrates through the source layer 14, the base layer 13 and the n-type layer 30 from the surface of the source layer 14 to reach the n-type pillar layer 11. The trench 20t is provided at the center of the n-type pillar layer 11. In the trench 20t, the gate electrode 21 is provided via the gate insulating film 20. The gate electrode 21 is adjacent to the base layer 13, the source layer 14, the n-type layer 30 and the n-type pillar layer 11 via the gate insulating film 20. The bottom surface of the n-type layer 30 is located closer to the base layer 13 than the lower end of the gate electrode 21. The distance between the bottom surface of the n-type layer 30 and the bottom surface of the base layer 13 is smaller than the distance between the lower end of the gate electrode 21 and the bottom surface of the base layer 13.

In the semiconductor device 3 as well, since the n-type layer 30 is adjacent to the trench 20t, when switching off the semiconductor device 3, the surroundings of the trench 20t are depleted after the super junction structure is completely depleted. Thus, in the semiconductor device 3 as well, the breakdown voltage of the gate insulating film 20 and the reliability of the switching control by the gate electrode 21 are improved.

Moreover, in the case where the n-type layer 30 of high concentration is provided directly below the base layer 13, electric field directly below the base layer 13 increases. However, in the semiconductor device 3, the concentration in the upper half portion of the p-type pillar layer 12 is set higher than that in the upper half portion of the n-type pillar layer 11 (see FIG. 9B). In the semiconductor device, the concentration in the lower half portion of the p-type pillar layer 12 is set lower than that in the lower half portion of the n-type pillar layer 11. As a result, in the semiconductor device 3, the electric field is strong at the central portion of the super junction structure (See FIG. 9C).

Therefore, in the semiconductor device 3, the electric field directly below the base layer 13 weakens, and an avalanche breakdown is likely to occur not at a portion directly below the base layer 13 but at the central portion of the p-type pillar layer 12. Thus, in the semiconductor device 3, a stable breakdown voltage is obtained. Moreover, since the electric field directly below the base layer 13 is weak, even if a large current flows in the semiconductor device 3 due to the avalanche breakdown, a negative resistance is difficult to be generated. As a result, in the semiconductor device 3, a high avalanche withstanding capability is obtained.

Fourth Embodiment

Figures 10A, 10B:
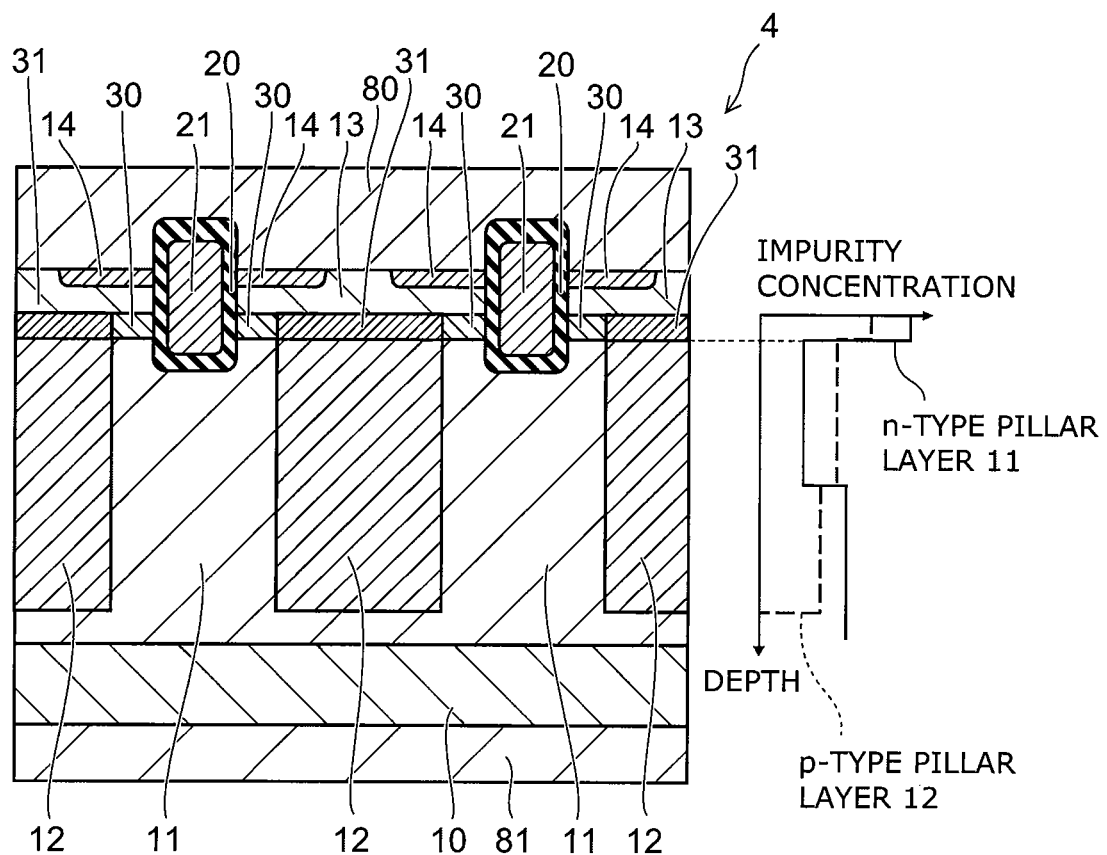
FIGS. 10A and 10B illustrate a semiconductor device according to a fourth embodiment, where

FIGS. 10A and 10B illustrate a semiconductor device according to a fourth embodiment. Specifically, FIG. 10A is a schematic cross-sectional view of a main part of the semiconductor device, and FIG. 10B is a graph illustrating a relationship between a depth direction of the semiconductor device and an impurity concentration.

A semiconductor device 4 shown in FIG. 10A is a variation of the semiconductor device 3. In the semiconductor device 4, the p-type layer (seventh semiconductor layer) 31 containing p-type impurities is provided between the base layer 13 and the p-type pillar layer 12. The p-type layer 31 contains p-type impurities having concentration higher than that of the p-type pillar layer 12. The p-type layer 31 is adjacent to the n-type layer 30.

In the semiconductor device 4 provided with the trench 20t, the depletion layer expands easily in a direction substantially parallel to the major surface of the drain layer 10 from the trench 20t. Therefore, in the surroundings of the trench 20t, it is possible to further increase the impurity concentration of the super junction structure as in the case of reducing cell pitch. Therefore, it is possible to form, on the p-type pillar layer 12, the p-type layer 31 of high concentration containing impurities having concentration higher than that of the p-type pillar layer 12.

Therefore, it is possible to further increase the impurity concentration of the n-type layer 30 adjacent to the p-type layer 31. As a result, in the semiconductor device 4, a lower on-resistance can be realized. Moreover, by forming the p-type layer 31 of high concentration, changes in Cds with respect to Vds is moderated more. As a result, in the semiconductor device 4, a switching noise is difficult to be generated.

Moreover, as shown in FIG. 10B, by setting the concentration of the p-type layer 31 lower than that of the n-type layer 30, the semiconductor device 4 has an electric field distribution similar to that shown in FIG. 9C. As a result, in the semiconductor device 4, the breakdown voltage of the gate insulating film 20 and the reliability of the switching control by the gate electrode 21 are improved.

Fifth Embodiment

Figure 11:
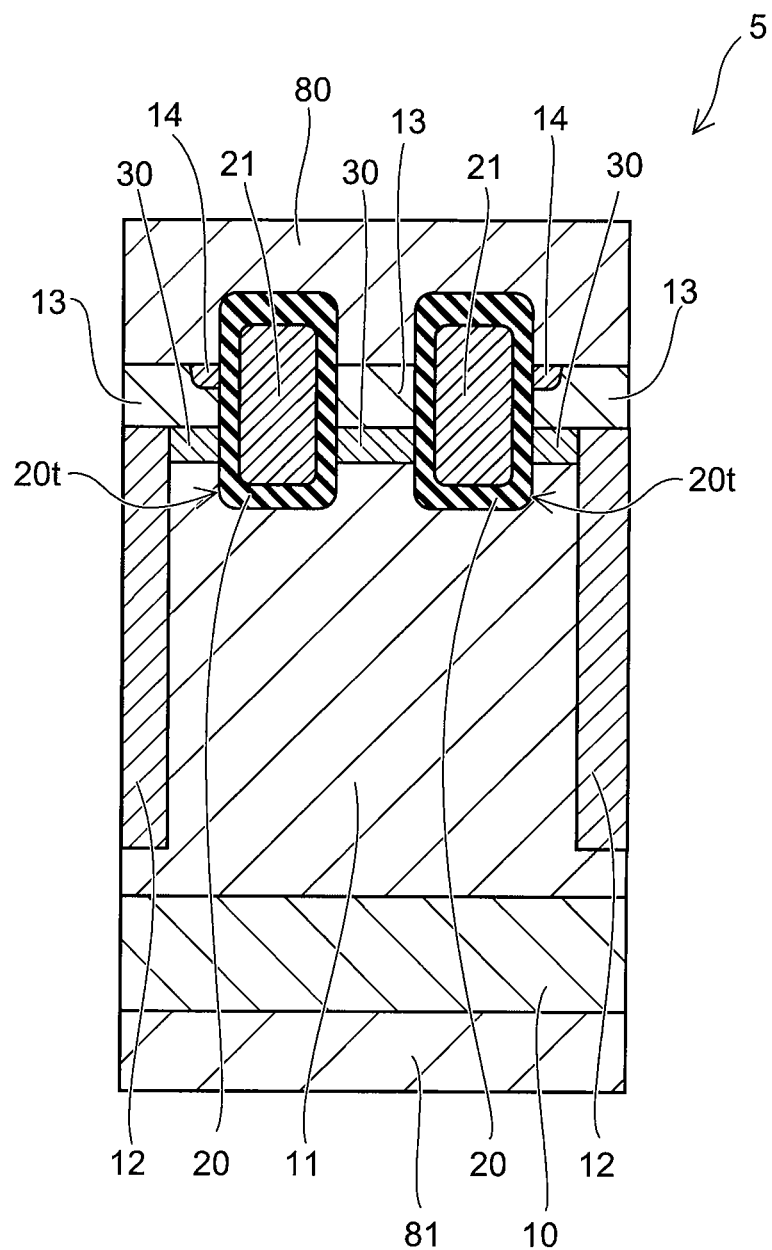
FIG. 11 is a schematic cross-sectional view of a main part of a semiconductor device according to a fifth embodiment.

FIG. 11 is a schematic cross-sectional view of a main part of a semiconductor device according to a fifth embodiment.

A semiconductor device 5 is another variation of the semiconductor device 3. In the semiconductor device 5, two of the adjacent trenches 20t penetrate through the base layer 13 and the n-type layer 30 from the surface of the base layer 13 to reach the n-type pillar layer 11. The two trenches 20t are in contact with the n-type pillar layer 11. Namely, the two trenches 20t contact the n-type pillar layer 11 and do not contact the p-type pillar layer 12. The source layer 14 is not provided on the surface of the base layer 13 sandwiched between the two trenches 20t. The source layers 14 selectively provided on the base layer 13 are respectively adjacent to the trenches 20t. The bottom surface of the n-type layer 30 is located closer to the base layer 13 than the lower end of the gate electrode 21. The distance between the bottom surface of the n-type layer 30 and the bottom surface of the base layer 13 is smaller than the distance between the lower end of the gate electrode 21 and the bottom surface of the base layer 13.

By providing the two trenches 20t on the n-type pillar layer 11, Cgd further increases. Moreover, by increasing an interval between the adjacent trenches 20t and reducing an interval between the trench 20t and the p-type pillar layer 12, it is possible to selectively pass the current generated at the avalanche breakdown into the base layer 13 between the adjacent trenches 20t. Furthermore, in the semiconductor device 5, the source layer 14 is not provided on the base layer 13 between the adjacent trenches 20t. Therefore, in the semiconductor device 5, the parasitic bipolar transistor by the source layer 14, the base layer 13 and the n-type layer 30 is not formed. Therefore, in the semiconductor device 5, a malfunction of the parasitic bipolar transistor is less likely to occur even if hole current due to the avalanche breakdown flows therein. As a result, the semiconductor device 5 has a high avalanche withstanding capability.

Sixth Embodiment

Figures 12A, 12B:
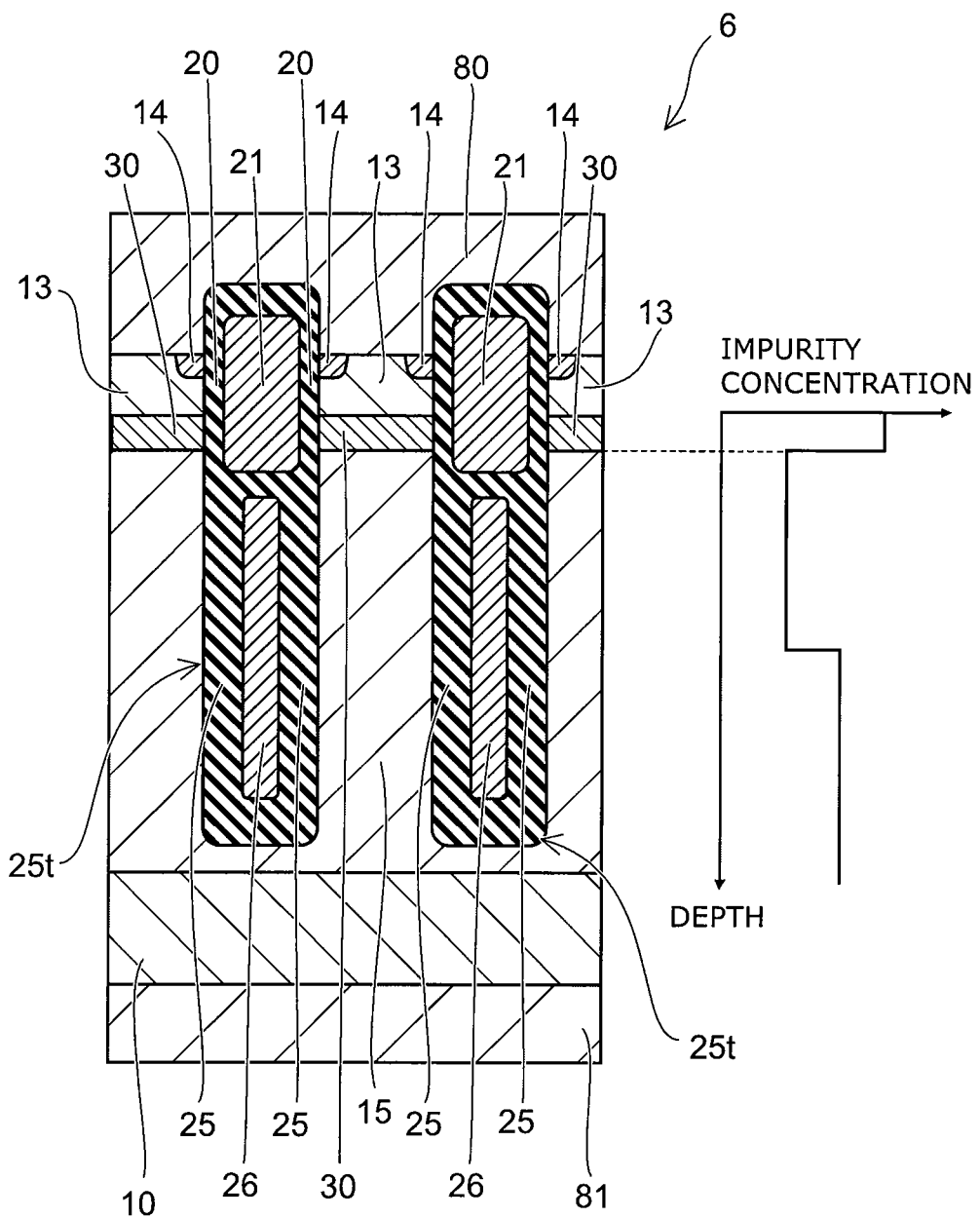
FIGS. 12A and 12B illustrate a semiconductor device according to a sixth embodiment, where

FIGS. 12A and 12B illustrate a semiconductor device according to a sixth embodiment. Specifically, FIG. 12A is a schematic cross-sectional view of a main part of the semiconductor device, and FIG. 12B is a graph illustrating a relationship between a depth direction of the semiconductor device and an impurity concentration.

In a semiconductor device 6 shown in FIG. 12A, the drift layer (second semiconductor layer) 15 of the $n^-$-type is provided on the drain layer 10. In other words, in the semiconductor device 6, the drift layer 15 without having the p-type pillar layer 12 formed therein is provided on the drain layer 10. The n-type layer 30 is provided on the drift layer 15. The base layer 13 is provided on the n-type layer 30. Namely, the n-type layer 30 containing n-type impurities having concentration higher than that of the drift layer 15 is provided between the base layer 13 and the drift layer 15. The source layer 14 is selectively provided on the surface of the base layer 13.

A trench 25t, which is deeper than the trench 20t in the inside of the drift layer 15, is provided to penetrate through the base layer 13 from the surface of the source layer 14. The trench 25t is in contact with the drift layer 15. The gate electrode 21 having a trench configuration is provided on the upper side of the trench 25t via the gate insulating film 20. The gate electrode 21 is adjacent to the base layer 13, the source layer 14, the n-type layer 30 and the drift layer 15 via the gate insulating film 20. The bottom surface of the n-type layer 30 is located closer to the base layer 13 than the lower end of the gate electrode 21. The distance between the bottom surface of the n-type layer 30 and the bottom surface of the base layer 13 is smaller than the distance between the lower end of the gate electrode 21 and the bottom surface of the base layer 13.

A field plate electrode 26 (embedded electrode) is provided under the gate electrode 21 via a field plate insulating film (second insulating film) 25. The field plate electrode 26 is, for example, electrically connected to the source electrode 80. As described, in the semiconductor device 6, not the super junction structure but the field plate structure is formed in the drift layer 15.

The functional effect of the semiconductor device 6 will be described.

When switching on the semiconductor device 6, with an application of a threshold voltage or higher to the gate electrode 21, a channel is formed in the base layer 13 to which the gate electrode 21 opposes via the gate insulating film 20. The current flows between the source electrode 80 and the drain electrode 81 through the source layer 14, the channel, the n-type layer 30, the drift layer 15 and the drain layer 10.

When switching off the semiconductor device 6, depletion layers extend from the interface between the trench 25t and the drift layer 15 to the n-type layer 30 side and the drift layer 15 side. Further, when the depletion layers are connected to one another in the drift layer 15, the drift layer 15 becomes completely depleted, and Cds decreases abruptly as described above.

Here, if the n-type layer 30 is not provided, as in the case of the semiconductor device 100 according to the comparative example, the surroundings of the gate insulating film 20 become depleted before the drift layer 15 becomes completely depleted. In this case, the capacitance (Cgd) between the gate electrode 21 and the drain electrode 81 decreases before the capacitance (Cds) between the drain electrode 81 and the source electrode 80 decreases abruptly. In this case, a switching noise is likely to be generated as described above.

In contrast, in the semiconductor device 6, since the n-type layer 30 is provided, even if Vds is applied, the surroundings of the gate insulating from 20 are difficult to be depleted. Namely, Cgd decreases after Cds decreases rapidly. Therefore, a rapid decrease in Cgd/Cds is suppressed. As a result, a switching noise is less likely to be generated in the semiconductor device 6.

As described above, it is possible to control the voltage at which Cgd decreases by the n-type layer 30 also in the semiconductor device 6 in which the field plate structure is formed in the drift layer 15.

Moreover, not only the structure in which the impurity concentration in the depth direction of the drift layer 15 is set constant, but also the structure in which the impurity concentration on the side of the drain electrode 81 is set higher than that on the side of the source electrode 80 as shown in FIG. 12B are included in the embodiment. By setting the impurity concentration to be higher on the side of the drain electrode 81 than on the side of the source electrode 80, it is possible to reduce the on-resistance while maintaining the high breakdown voltage. Furthermore, by locating the bottom surface of the n-type layer 30 of higher concentration at a position shallower than the lower end of the gate electrode 21, the breakdown voltage of the gate insulating film 20 and the reliability of the switching control by the gate electrode 21 are improved.

The foregoing embodiments are not limited to these specific examples. More specifically, those skilled in the art can suitably modify these examples, and such modifications are also encompassed within the scope of the invention as long as they have the characteristic of the embodiment. For instance, the layout, material, condition, shape, size and the like of the components included in the above examples are not limited to those illustrated, but can be suitably modified. Additionally, the foregoing embodiments are not necessarily to be independent from one another but may be suitably combined. In the embodiments, for example, the n-type is indicated as a first conductivity-type, and the p-type is indicated as a second conductivity-type. Similarly, the n-type may be indicated as the second conductivity-type, and the p-type may be indicated as the first conductivity-type.

For example, the planar pattern of the gate electrode 21, the super junction structure and the field plate structure is not limited to the stripe configuration, and may be formed in a grid configuration, a zigzag configuration or a honeycomb configuration.

For example, although a structure in which the p-type pillar layer 12 and the field plate insulating film 25 are not in contact with the drain layer 10 is shown, a structure in which the p-type pillar layer 12 and the field plate insulating film 25 are in contact with the drain layer 10 may be also implemented.

In the foregoing, silicon (Si) has been described as a semiconductor material. However, for example, compound semiconductors made of silicon carbide (SiC), gallium nitride (GaN) or the like, and wide-bandgap semiconductors such as diamond can be used as the semiconductor material.

The method for manufacturing a semiconductor device is not limited to the above-described manufacturing processes illustrated in FIGS. 2A to 5B. For example, manufacturing the super junction structure is not limited to the manufacturing process of forming a pillar layer by epitaxial growth, but also includes other processes such as a manufacturing process of repeating ion implantation and embedded crystal growth multiple times, or a manufacturing process of forming a pillar layer by ion implantation with variable acceleration voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a first semiconductor layer of a first conductivity type;
a second semiconductor layer of the first conductivity type and a third semiconductor layer of a second conductivity type alternately provided on the first semiconductor layer along a first direction that is substantially parallel to a major surface of the first semiconductor layer;
a fourth semiconductor layer of the second conductivity type provided on the second semiconductor layer and the third semiconductor layer;
a fifth semiconductor layer of the first conductivity type selectively provided on a surface of the fourth semiconductor layer;
a plurality of control electrodes spaced from the fifth semiconductor layer, the fourth semiconductor layer, and the second semiconductor layer by an insulating film;
a first electrode connected to the first semiconductor layer;
a second electrode connected to the fourth semiconductor layer and the fifth semiconductor layer;
a sixth semiconductor layer of the first conductivity type provided between the fourth semiconductor layer and the second semiconductor layer, a bottom surface of the sixth semiconductor layer being at level that is higher than a level of a bottom surface of each control electrode,
an impurity concentration of the sixth semiconductor layer being higher than an impurity concentration of the second semiconductor layer, and
the control electrodes being spaced along the first direction at a pitch that is less than a pitch at which the second semiconductor layer and the third semiconductor layer are alternately provided in the first direction.

2. The device according to claim 1, wherein the second semiconductor layer, the third semiconductor layer, the fourth semiconductor layer, the fifth semiconductor layer, and the control electrode extend in a same direction respectively as viewed in a direction perpendicular to the major surface of the first semiconductor layer.

3. The device according to claim 1, wherein each of the control electrodes is in contact with the second semiconductor layer and also in contact with the third semiconductor layer via the insulating film.

4. The device according to claim 1, wherein a distance between a bottom surface of the sixth semiconductor layer and a bottom surface of the fourth semiconductor layer is smaller than a distance between a lower end of each control electrode and the bottom surface of the fourth semiconductor layer.

5. The device according to claim 1, wherein two of the control electrodes are in contact with the second semiconductor layer via the insulating film.

6. The device according to claim 5, wherein the fifth semiconductor layer is not provided on the surface of the fourth semiconductor layer which is sandwiched between the two of the control electrodes and provided on the second semiconductor layer.

7. The device according to claim 5, wherein the sixth semiconductor layer is sandwiched between the two of the control electrodes, and the fifth semiconductor layer is not provided on the surface of the fourth semiconductor layer provided on the sixth semiconductor layer sandwiched between the two of the control electrodes.

8. The device according to claim 1, wherein the fifth semiconductor layer is selectively provided on the surface of the fourth semiconductor layer on the third semiconductor layer.

9. The device according to claim 1, wherein each control electrode is provided at a central portion of the second semiconductor layer.

10. The device according to claim 1, wherein the fifth semiconductor layer extends from the surface of the fourth semiconductor layer on the second semiconductor layer to the surface of the fourth semiconductor layer on the third semiconductor layer.

11. The device according to claim 1, wherein an impurity concentration of an upper half portion of the third semiconductor layer is higher than an impurity concentration of an upper half portion of the second semiconductor layer.

12. The device according to claim 1, wherein an impurity concentration of a lower half portion of the third semiconductor layer is lower than an impurity concentration of a lower half portion of the second semiconductor layer.

13. The device according to claim 1, further comprising:
a seventh semiconductor layer of the second conductivity type provided between the fourth semiconductor layer and the third semiconductor layer and including an impurity having a concentration higher than an impurity concentration of the third semiconductor layer.

14. The device according to claim 13, wherein the seventh semiconductor layer is in contact with the sixth semiconductor layer.

15. The device according to claim 13, wherein an impurity concentration of the seventh semiconductor layer is lower than an impurity concentration of the sixth semiconductor layer.

16. The device according to claim 1, wherein two of the control electrodes are spaced from the second semiconductor layer by the insulating film, and the two of the control electrodes are not spaced from the third semiconductor layer by the insulating film.

17. The device according to claim 16, wherein the fifth semiconductor layer is not provided on the surface of the fourth semiconductor layer sandwiched between the two of the control electrodes.

18. A semiconductor device, comprising:
a first semiconductor layer of a first conductivity type;
a second semiconductor layer of the first conductivity type provided on the first semiconductor layer;
a fourth semiconductor layer of a second conductivity type provided on the second semiconductor layer;
a fifth semiconductor layer of the first conductivity type selectively provided on a surface of the fourth semiconductor layer;
a plurality of control electrodes spaced from the fifth semiconductor layer, the fourth semiconductor layer, and the second semiconductor layer by a first insulating film;
an embedded electrode spaced from the second semiconductor layer by a second insulating film under the control electrode;
a first electrode connected to the first semiconductor layer;
a second electrode connected to the fourth semiconductor layer and the fifth semiconductor layer; and
a sixth semiconductor layer of the first conductivity type provided between the fourth semiconductor layer and the second semiconductor layer, a bottom surface of the sixth semiconductor layer being higher than a lower end of each control electrode,
an impurity concentration of the sixth semiconductor layer being higher than an impurity concentration of the second semiconductor layer.

19. The device according to claim 18, wherein a distance between the bottom surface of the sixth semiconductor layer and a bottom surface of the fourth semiconductor layer is smaller than a distance between the lower end of each control electrode and the bottom surface of the fourth semiconductor layer.

20. The device according to claim 18, wherein the embedded electrode is electrically connected to the second electrode.

* * * * *